United States Patent [19]

Yamamoto et al.

[11] Patent Number: 4,542,315
[45] Date of Patent: Sep. 17, 1985

[54] CHIP-SHAPED PIEZOELECTRIC VIBRATOR MOUNT

[75] Inventors: Takashi Yamamoto, Hakui; Houdo Kitajima, Takaoka, both of Japan

[73] Assignee: Murata Manufacturing Co., Ltd., Kyoto, Japan

[21] Appl. No.: 610,815

[22] Filed: May 15, 1984

[51] Int. Cl.⁴ ............................................. H01L 41/08
[52] U.S. Cl. .................................. 310/348; 310/319; 310/344; 310/356
[58] Field of Search ............................ 310/348–356, 310/319, 344

[56] References Cited

U.S. PATENT DOCUMENTS

| | | | |
|---|---|---|---|
| 2,341,683 | 2/1944 | Bailey | 310/356 |
| 2,395,034 | 2/1946 | Bokovoy | 310/356 |
| 2,691,159 | 10/1954 | Heibel | 310/319 |
| 3,294,988 | 12/1966 | Packard | 310/319 |
| 3,969,640 | 7/1976 | Staudte | 310/370 X |
| 4,145,627 | 3/1979 | Ishizawa | 310/344 |
| 4,283,650 | 8/1981 | Koyama | 310/344 |

Primary Examiner—Mark O. Budd
Attorney, Agent, or Firm—Wenderoth, Lind & Ponack

[57] ABSTRACT

A chip-shaped piezoelectric vibration part provided integrally with capacitors and resistances, which is so constructed that a piezoelectric element including a pair of vibrating electrodes is housed in a tubular casing whose openings at both axial ends are covered by respective caps, both vibrating electrodes being connected with the caps corresponding thereto through conductive connecting materials, the tubular casing being provided with either one or both of the capacitor and resistance, so that the part is small-sized as a whole to enable its integration degree for package to be improved and is easy to handle.

3 Claims, 20 Drawing Figures

CHIP-SHAPED PIEZOELECTRIC VIBRATOR MOUNT

BACKGROUND OF THE INVENTION

This invention relates to a chip-shaped piezoelectric vibrator provided integrally with capacitors and resistances in a tubular casing.

For example, a two-terminal type oscillator known as the chip-shaped piezoelectric vibrator is used for a circuit shown in FIG. 12, in which an example of an oscillation circuit utilizing the chip-shaped piezoelectric vibrator of the present invention is shown.

In FIG. 12, an integrated circuit 21 includes an inverter INV connected with terminals 22 and 23 of the circuit 21. A chip-shaped piezoelectric vibrator X and a feedback resistance R, which constitute an oscillation circuit in cooperation with the inverter INV, are connected in parallel to each other, the terminals 22 and 23 respectively connecting with grounded capactors $C_1$ and $C_2$. The capacitors $C_1$ and $C_2$ each are of load capacity and provide positive feedback by the circuit including the vibrator X and the inverter INV, the feedback resistance R being interposed for suppressing self-oscillation of an amplifier included in the inverter and being usually of resistance value of 500 K$\Omega$ to 10 M$\Omega$. Also, an output of vibrator X, that is, an oscillation output, is introduced from the terminal 23.

Conventionally, since the resistance R, and capacitors $C_1$ and $C_2$ have been separate from each other, they must be arranged at the user side and then the troublesome assembly and wirings must be carried out, resulting in that the degree of integration for a wiring substrate has not been improved.

An object of the invention is to provide a chip-shaped piezoelectric vibrator which is provided integrally with either one or both of resistance and capacitance and is very compact and simple to handle.

Another object of the invention is to provide a chip-shaped piezoelectric vibrator which is made compact to improve the degree of integration thereof.

The above and other objects and features of the invention will be more fully apparent from a consideration of the following description taken in connection with the accompanying drawing wherein several embodiments are illustrated by way of example.

DETAILED DESCRIPTION OF THE PREFERRED EMBODIMENTS

Figure 1:
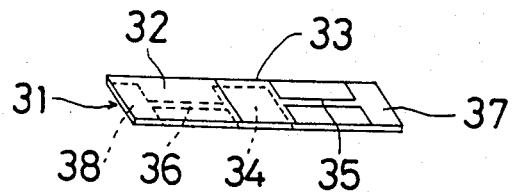
FIG. 1 is a perspective view exemplary of a piezoelectric element.

An example of the chip-shaped piezoelectric vibration element cited in the above background of the invention and applicable thereto is shown in FIG. 1, in which a piezoelectric vibration element 31 includes a piezoelectric plate 32 of, for example, ceramic and vibrating electrodes 33 and 34 formed opposite the respective opposite surfaces of plate 32.

The vibrating electrodes 33 and 34, in cooperation with each other, generate at the piezoelectric plate 32 the energy-trap type thicknesswise slide vibration and connect with lead-out electrodes 37 and 38 through lead electrodes 35 and 36 respectively.

Figure 2:
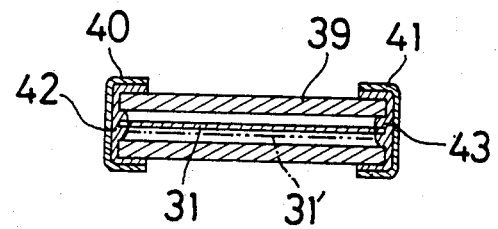
FIG. 2 is a sectional view explanatory of an example of a chip-shaped piezoelectric vibrator.

Such a piezoelectric element 31, for example, is housed in a casing 39 as shown in FIG. 2, the casing 39 (namely, the element having a bore its center) being tubular and having at both axial ends, respective openings covered by caps 40 and 41.

The caps 40 and 41 and lead-out electrodes 37 and 38 (in FIG. 1) housed in the casing 39, are electrically connected by conductive connecting materials 42 and 43, such as a conductive paint or creamy solder to thus form the chip-shaped piezoelectric vibrator.

Such a chip-shaped piezoelectric vibrator can be produced more inexpensively and small-sized, thereby being applicable in various technical fields.

Figure 3A:
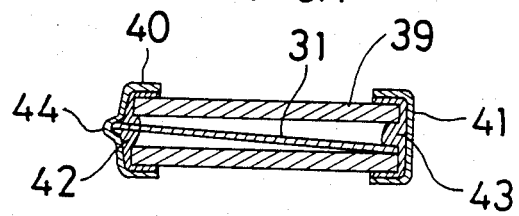
FIG. 3A is a sectional view explanatory of an embodiment of a chip-shaped piezoelectric vibrator used in the invention.
Figure 3B:
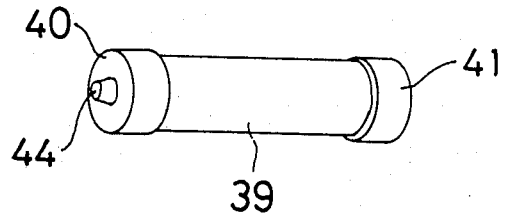
FIG. 3B is a perspective external view thereof.

An embodiment of the chip-shaped piezoelectric vibrator of the invention is shown in FIGS. 3A and 3B, which is usable of the conventional piezoelectric element as shown in FIG. 1.

In addition, in FIG. 1, the vibrating electrodes 33 and 34 are connected with the lead-out electrode 37 and 38 through thin lead electrodes 35 and 36, respectively. The connecting or lead electrodes 35 and 36 may alternatively be formed throughout an overall width of the piezoelectric plate. The piezoelectric element 31 is housed in a tubular casing 39 of, for example, synthetic resin, alumina (ceramic), or glass, the casing 39 having both end openings covered by the caps 40 and 41 electrically connected with the lead-out electrodes 37 and 38 through conductive connecting materials 42 and 43 as aforesaid.

The caps 40 and 41 each include a first portion corresponding to each axial end opening of tubular casing 39 and a second portion extending from the first portion along the outer periphery of casing 39, the first portion of one cap 40 having a projection 44 projecting axially outwardly from the casing 39. In addition, since the caps 40 and 41 are formed of a thin plate of conductive material, such as aluminum or copper, the projection 44 is easy to form by the well-known press working process, and one end element 31 engages with a recess formed by the projection 44.

Therefore, in this embodiment, the element 31 is housed slantwise in the casing 39 as shown in FIG. 3A. In this case, the lead-out electrode 38 (in FIG. 1) formed at the other end of element 31 comes into contact with the inner surface of the wall of casing 39, but a substantially central portion at the element 31 corresponding to the vibrating electrodes 33 and 34 (FIG. 1) never contacts the inner surface of the same. In other words, the vibrating portion of element 31 is maintained spaced from the inner surface of wall of casing 39.

Figure 4:
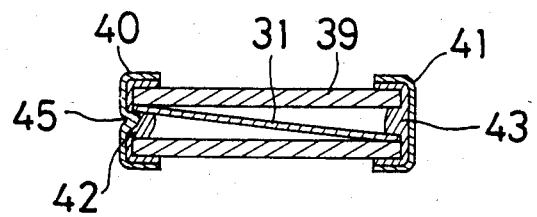
FIGS. 4 and 5 are sectional views explanatory of modified embodiments of the chip-shaped vibrator used in the invention.

The chip-shaped piezoelectric vibrator in the FIG. 4 embodiment is different from that in FIG. 3A in the form of cap 40. In other words, the embodiment of FIGS. 3A and 3B uses the projection 44 of the cap 40 to form a stepped portion for positioning the element 31, while, in the FIG. 4 embodiment, the cap 40 is recessed at 45 inwardly of casing 39 to form an inwardly projecting stepped portion by which the element 31 is held at one end thereof. In this case also, the vibrating electrode portion at a substantially central portion of element 31 is maintained spaced from the inner surface of wall of the casing 39.

Figure 5:
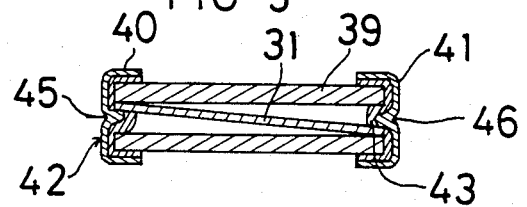

The chip-shaped piezoelectric vibrator in the FIG. 5 embodiment is provided also at the cap 41 with a recess 46 to form an inward projection, by which the piezoelectric element 31 is positioned and more mechanically stable.

Figure 6A:
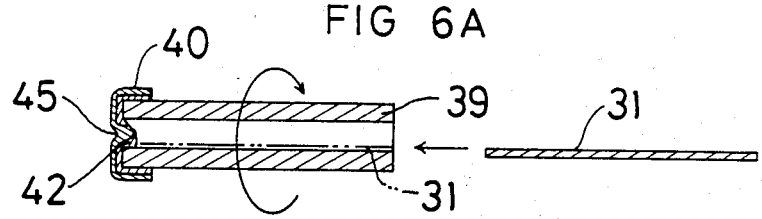
FIGS. 6A and 6B are illustrations of the manufacturing process for the piezoelectric vibrator in FIG. 5, FIGS. 7 and 8 are sectional view explanatory of further modified embodiments of the chip-shaped piezoelectric vibrator of the invention.
Figure 6B:
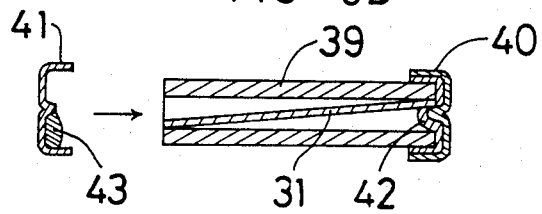

Such a chip-shaped piezoelectric vibrator as is shown in FIG. 5 can be produced as shown in FIGS. 6A and 6B in such a manner that a tubular casing 39 open at both axial ends is prepared, a cap 40 having a recess 45 is disposed to cover one axial end of casing 39 after creamy solder or conductive paint 42 has previously been coated on the cap 40, the piezoelectric element 31 shown in FIG. 1 is inserted into the casing 39 through the other open end thereof, and the element 31 is positioned as shown by the two-dot-chain line in FIG. 6A.

The casing 39, as shown in FIG. 6A, is rotated by 180° around the lengthwise axis, whereby the piezoelectric element 31 falls down at the other end by its weight so as to contact the inner surface of the casing wall, and thereafter the cap 41 previously coated by conductive paste or conductive paint 43 is fitted onto the other end of casing 39, thus completing the piezoelectric vibrator as shown in FIG. 5.

Figure 7:
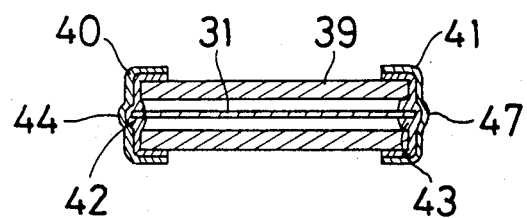

The chip-shaped piezoelectric vibrator in the FIG. 7 embodiment is a modification of the vibrator shown in FIGS. 3A and 3B. In detail, the vibrator in FIG. 7 has at both the caps 40 and 41 projections 47 projecting outwardly from the casing 39, both caps 40 and 41 being provided with a respective stepped portion for positioning the piezoelectric element 31. Thus, the element 31 can be supported in the casing 39 and in parallel to the wall thereof.

Figure 8:
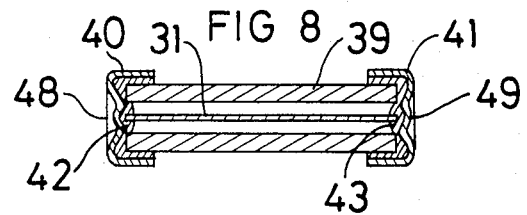

The chip-shaped piezoelectric vibrator in the FIG. 8 embodiment supports a piezoelectric element 31 within a casing 39 in parallel to the wall thereof, the same as in FIG. 7, the caps 40 and 41 providing projections 48 and 49 projecting outwardly from the casing 39. The projections 48 and 49, however, each are lower at the crest than the peripheral edge of the respective caps 40 and 41.

Also, in this embodiment, the piezoelectric element 31 is supportable in the casing 39 in parallel to the wall thereof, the same as in FIG. 7. Moreover, since the projections 48 and 49 retract at the crests thereof inwardly from the peripheral edges of caps 40 and 41 respectively, the vibrator is easy to handle, as are the FIG. 4 and FIG. 5 embodiments.

Figure 9:
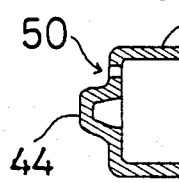
FIG. 9 is an illustration exemplary of another cap.

The chip-shaped piezoelectric vibrator in the FIG. 9 embodiment has at a cap 40 a projection 44 projecting outwardly from the casing 39 as in FIGS. 3A and 7. A bore 50 is formed at a first portion of cap 40 corresponding to the end face of casing 39, and is utilized for injecting into the casing 39 a conductive binding material, such as molten solder, for electrically connecting the electrodes at the piezoelectric element 31 with the respective caps thereof. Incidentally, the former embodiments each apply the conductive paint or molten solder previously on the caps 40 and 41 for electrically connecting the element 31 therewith, but the FIG. 9 embodiment can conductively connect the element 31 and caps 40 and 41 by injecting the molten solder into the casing 39 through the bore 50 after assembly of them.

Figure 10A:
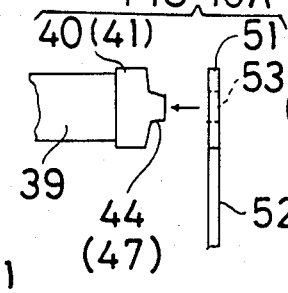
FIGS. 10A and 10B illustrate an exemplary connection of the cap in FIG. 9 with a lead-out terminal.
Figure 10B:
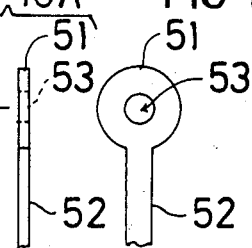

The chip-shaped piezoelectric vibration part of the embodiment of FIGS. 10A and 10B is provided at caps 40 and 41 with respective projections 44 and 47 projecting axially outwardly from the casing 39 in FIGS. 3A and 7, the caps 40 and 41 being utilized to enable connection of the lead-out terminals 51 directly with the projections 44 and 47. The lead-out terminal 51 includes an approximately round head and a leg 52 extending therefrom, the head being provided with a bore 53 of a diameter approximately equal to an outer diameter of each projection 44 and 47 at each cap 40 and 41, so that the projections 44 and 47 are fitted just into the bores 53 at the lead-out terminals 51, whereby the projections 44 and 47 and the heads of lead-out terminals 51, are, for example, soldered to enable the piezoelectric vibrator having the lead-out terminals to be simply constructed.

In the aforesaid embodiments, the caps 40 and 41 are not fixed to the casing 39 by a particular mechanical means other than a binding force of conductive paint or solder. In some cases, however, external stress causes the cap 40 and 41 to escape from the casing 39 to result in a breakdown of the chip-shaped piezoelectric vibrator itself.

Figure 11:
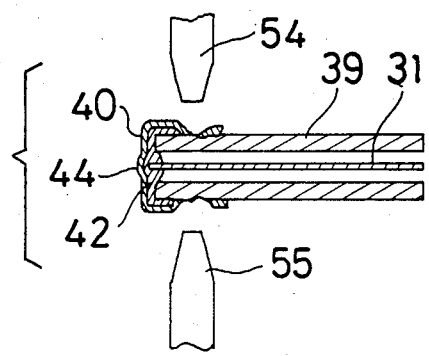
FIG. 11 is an illustration exemplary of mechanical fixing of the cap.

Therefore, the chip-shaped piezoelectric vibrator in the FIG. 11 embodiment provides a piezoelectric element 31 in a resin casing 39, in which a cap 40 coated with conductive paint 42 covers the end of casing 39, the cap 40 is punched in part by punches 54 and 55 to thereby break part of cap 40 extending along the wall of casing 39, and "burrs" produced by the punching are allowed to encroach on the wall of casing 39. Thus, the resin casing 39 and cap 40 can be fixedly connected more mechanically stably.

The embodiment of the invention houses the piezoelectric element 31 in the tubular casing 39 formed of a electrically nonconductive and heat resistant material, such as glass or ceramic, and the caps 40 and 41 cover both axial ends of casing 39. In addition, the aforesaid embodiments inclusive of this embodiment may of course be applicable to the construction of housing and supporting the piezoelectric element 31. For example, the embodiment in FIG. 13A may use the cap 40 having no projection. Furthermore, the piezoelectric elements all inclined from a minimum to a maximum slant angle as shown in FIGS. 3A through 13A are included in the present invention, which can be applied also to the following embodiments.

Referring again to FIG. 13A, the tubular casing 39 is provided at one side of the outer periphery with a resistive film 56, such as an oxide film or carbon, through which the feedback resistance R to be connected in parallel to the inverter INV, and the vibrator X, is integral therewith.

Incidentally, the resistive film 56, may be baked at a high temperature and have a resistance value of which may be adjusted to be in the aforesaid necessary range of resistance values of 500 KΩ to 10 MΩ.

Figure 13A:
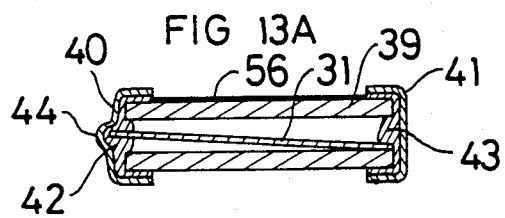
FIG. 13A is a sectional view explanatory of another modified embodiment of the chip-shaped piezoelectric vibrator of the invention.
Figure 13B:
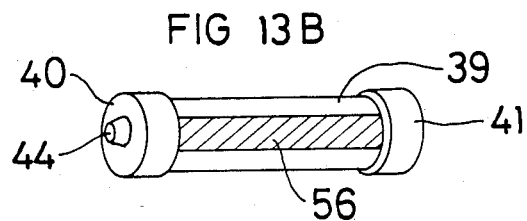
FIG. 13B is a perspective external view thereof.

Futhermore, the embodiment in FIGS. 13A and 13B enables the resonator and resistance to be composite with each other without adding any particular process. Also, since the resistive film is of about 10 to 60 μm thick, the problem of a finished chip-shaped piezoelectric vibrator which is especially large-sized is not created.

Figure 14:
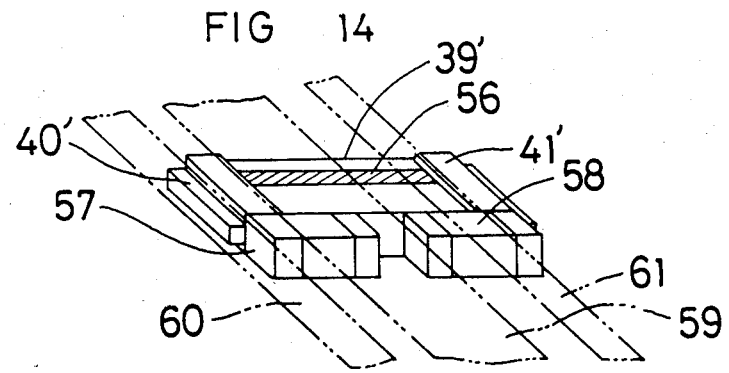
FIG. 14 is a perspective external view of still another modified embodiment of the invention.

The embodiment shown in FIG. 14 is intended to further compound the capacitors $C_1$ and $C_2$.

Referring to FIG. 14, a rectangular casing 39' contains therein a piezoelectric element as shown in FIG. 1, the casing 39' being covered at both open ends with caps 40' and 41', which are provided with desired positioning portions (stepped portions) for positioning the element 31 contained in the casing 39. The casing 39' has at its upper surface a resistive film 56 and has two chip-shaped capacitors 57 and 58 mounted to one side surface of the same, the capacitors 57 and 58 respectively corresponding to the capacitors $C_1$ and $C_2$ in FIG. 12 and being provided at respective opposite ends of said one side surface. In addition, the chip-shaped capacitors 57 and 58 and casing 39' are integral with each other by, for example, being bound with an adhesive.

Figure 12:
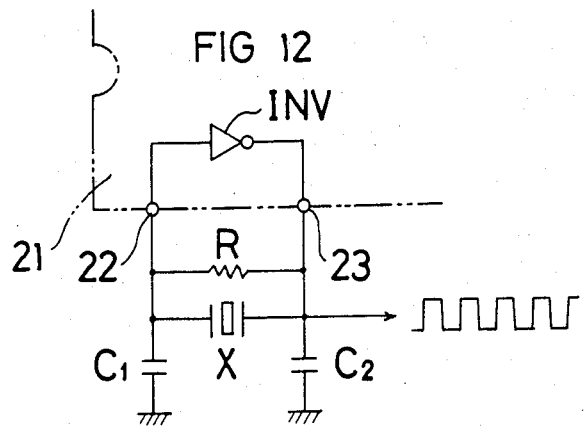
FIG. 12 is a circuit diagram of an example of an oscillation circuit using the chip-shaped piezoelectric vibrator of the invention.

Then, such assembled chip-shaped piezoelectric vibrator is connected to print patterns 59, 60 and 61 on, for example, a substrate (not shown). In other words, the grounded pattern 59 is connected with one capacitor electrode of each of the respective chip capacitors 57 and 58, and the patterns 60 and 61 to be connected to, for example, the respective terminals 22 and 23 of the integrated circuit 21 in FIG. 12, are connected with the cap 40' and the other capacitor electrode of chip capacitor 57 and the cap 41' and the other capacitor electrode of that 58, respectively.

Concretely, the chip-shaped piezoelectric vibrator contained in the rectangular casing 39' is 2.2 mm thick, 2.2 mm wide and 6.9 mm long and the chip capacitors 57 and 58 each are sized, for example, 1.6 mm wide and 3.2 mm long.

In the embodiments illustrated in FIGS. 13A, 13B and 14, the resistive film formed at the lateral side of casing 39 or 39' may alternatively be formed throughout the side and not limited in position. Hence, the film may be provided at the outer or inner surface of the lateral wall or the overall peripheral surface of the casing, where it is conditioned to connect the film with the caps 40 and 41 or caps 40' and 41'.

Figure 15:
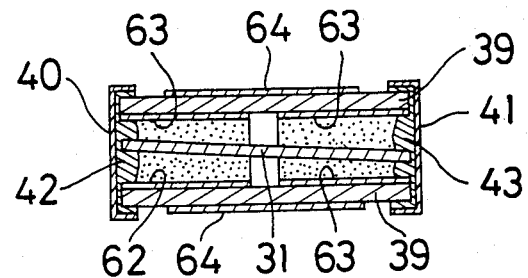
FIG. 15 is a sectional view explanatory of a still further modified embodiment of the invention.

An embodiment illustrated in FIG. 15 includes a casing 39 formed itself of a dielectric and is provided at the overall inner peripheral surface of casing 39 with one electrode 62 of a capacitor $C_1$ and one electrode 63 of a capacitor $C_2$ separate from each other but being respectively conductive with the caps 40 and 41. This embodiment is also provided at a substantially central portion of the outer periphery of casing 39 with common electrodes 64 for the capacitors $C_1$ and $C_2$, spaced from the end caps so as to be electrically insulated therefrom in which the resistance R is mounted outside, and the capacitor electrodes 62, 63 and 64 need not be provided inevitably at the overall periphery.

Figure 16:
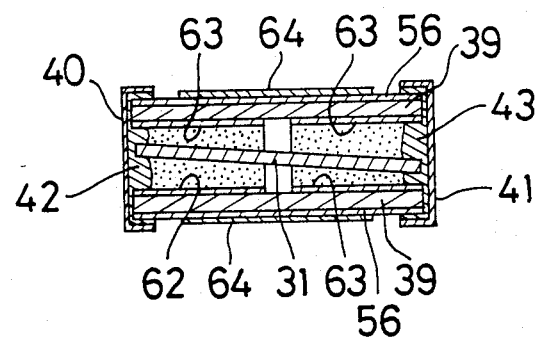
FIG. 16 is a sectional view explanatory of a yet further modified embodiment of the invention.

An embodiment illustrated in FIG. 16 is provided at the overall outer periphery of casing 39 of the FIG. 15 embodiment with resistive films 56, in which capacitor electrodes 64 are provided on the respective films 56. The resistive films 56 may be provided at the overall inner peripheral surface of the casing, at the overall inner and outer peripheral surfaces, or of course on part thereof as shown in FIG. 13B. Also, the capacitor electrodes and resistive films may alternatively not be overlapped but insulated from each other at the surface of casing 39.

Thus, the resistances or capacitors constituting the oscillation circuit in cooperation with the vibrator, as well as the vibrator, can be integral, thereby making the piezoelectric vibrator of the invention very compact, simple to handle, and have greater integration.

Incidentally, in the aforesaid embodiments, the tubular casing is combined with the round caps and the rectangular ones with rectangular caps, but, for example, a reactangular casing with round ends is covered by round caps.

Furthermore, the caps in the aforesaid embodiments can, as has been illustrated be fitted at both ends of the casing along the outside thereof, or may, alternatively, be fitted into both ends of the casing along the inner peripheral surface (the inner surface of the wall) of the casing.

Also, the caps 40 and 41 shown in FIGS. 3A and 3B through 8 may desirably be have portions, but of course, are not limited to the illustrated form thereof.

Although several embodiments have been described, they are merely exemplary of the invention and not to be constructed as limiting, the invention being defined solely by the appended claims.

What is claimed is:

1. A piezoelectric device, comprising:
   a dielectric case having an axially extending bore having opposite first and second ends, having respective first and second openings at said first and second ends, said case having an outer peripheral surface, and having an inner circumferential surface defining said bore;
   a piezoelectric element housed in said case having first and second vibrating electrodes respectively adjacent said first and second ends;
   first and second caps respectively covering said first and second ends so as to close said first and second openings;
   first and second masses of electrically conductive material respectively connecting said first and second caps to said first and second vibrating electrodes;
   a first electrode film integrally formed on said inner circumferential surface adjacent said first opening, electrically connected to said first cap by said first mass of electrically conductive material;
   a second electrode film integrally formed on said inner circumferential surface adjacent said second opening and axially spaced from said first electrode film, electrically connected to said second cap by said second mass of electrically conductive material; and
   a continuous electrode film integrally formed on said outer peripheral surface between said first and second ends, spaced from said first and second caps so as to be electrically insulated therefrom, opposing said first electrode film so as to define a first electrostatic capacitor integrally formed with said casing, and opposing said second electrode film so as to define a second electrostatic capacitor integrally formed with said casing.

2. A piezoelectric device, comprising:

a dielectric case having an axially extending bore having opposite first and second ends, having respective first and second openings at said first and second ends, said case having an outer peripheral surface, and having an inner circumferential surface defining said bore;

a piezoelectric element housed in said case having first and second vibrating electrodes respectively adjacent said first and second ends;

first and second caps respectively covering said first and second ends so as to close said first and second openings;

first and second masses of electrically conductive material respectively connecting said first and second caps to said first and second vibrating electrodes;

a resistive film integrally formed on one of said inner circumferential surface and said outer peripheral surface and electrically connected with said first and second caps at opposite axial ends thereof;

a first electrode film integrally formed on said inner circumferential surface adjacent said first opening, electrically connected to said first cap by said first mass of electrically conductive material;

a second electrode film integrally formed on said inner circumferential surface adjacent said second opening and axially spaced from said first electrode film, electrically connected to said second cap by said second mass of electrically conductive material; and a continuous third electrode film integrally formed on said outer peripheral surface between said first and second ends, spaced from said first and second caps so as to electrically insulated therefrom, opposing said first electrode film so as to define a first electrostatic capacitor integrally formed with said casing, and opposing said second electrode film so as to define a second electrostatic capacitor integrally formed with said casing.

3. A piezoelectric device as in claim 2, wherein one of said resistive film and said third electrode film overlays the other of said resistance film and said third electrode film.

* * * * *